(12) United States Patent
Cha et al.

(10) Patent No.: US 6,558,994 B2
(45) Date of Patent: May 6, 2003

(54) DUAL SILICON-ON-INSULATOR DEVICE WAFER DIE

(75) Inventors: Randall Cher Liang Cha, Singapore (SG); Yeow Kheng Lim, Singapore (SG); Alex See, Singapore (SG); Tae Jong Lee, Singapore (SG); Wang Ling Goh, Singapore (SG)

(73) Assignee: Chartered Semiconductors Maufacturing Ltd. (SG)

( * ) Notice: Subject to any disclaimer, the term of this patent is extended or adjusted under 35 U.S.C. 154(b) by 140 days.

(21) Appl. No.: 09/841,564

(22) Filed: Mar. 1, 2001

(65) Prior Publication Data

US 2002/0127816 A1 Sep. 12, 2002

(51) Int. Cl.$^7$ .................. H01L 21/00; H01L 21/84; H01L 27/01; H01L 27/12; H01L 31/0392
(52) U.S. Cl. .................. 438/163; 438/154; 438/155; 438/164; 438/967; 257/348; 257/351; 257/354; 257/402; 257/507
(58) Field of Search .................. 438/155, 163, 438/164, 165, 967, 153, 152; 257/350, 351, 353, 354, 496, 348, 402, 507, 524, 352, 372, 492–3, 504

(56) References Cited

U.S. PATENT DOCUMENTS 6,121,077 A * 9/2000 Hu et al. .................. 438/164

* cited by examiner

Primary Examiner—Olik Chaudhuri
Assistant Examiner—Neal Berezny
(74) Attorney, Agent, or Firm—Mikio Ishimaru

(57) ABSTRACT

A silicon-on-insulator semiconductor device and manufacturing method therefor is provided in which a single wafer die contains a transistor over an insulator layer to form a fully depleted silicon-on-insulator device and a transistor formed in a semiconductor island over an insulator structure on the semiconductor wafer forms a partially depleted silicon-on-insulator device.

13 Claims, 3 Drawing Sheets

DUAL SILICON-ON-INSULATOR DEVICE WAFER DIE

TECHNICAL FIELD

The present invention relates generally to silicon-on-insulator devices and more particularly to integration of partially and fully depleted silicon-on-insulator devices on a single wafer die.

BACKGROUND ART

Silicon-on-insulator (SOI) devices have often been dubbed as the next successor to the reigning complimentary metal-on-silicon (CMOS) field effect transistors (FET) devices. SOI device advantages include excellent isolation protection against cross-talk, almost null leakage, latch-up immunity, radiation hardness, reduced junction capacitance, and reduced junction leakage currents. In addition, fully depleted SOI devices offer additional advantages. They provide reduced short channel effect, near ideal sub-threshold slope, increased transconductance, and reduced threshold voltage ($V_t$) sensitivity to changes in body doping, channel length, temperature, and substrate voltage. Fully depleted SOI devices are those in which the layer of semiconductor is sufficiently thin that the entire thickness of the body region is depleted of majority carriers when in the off state and both diffusion junctions are at ground.

In some CMOS FET devices, n-channel MOS transistors are coupled to a complimentary p-channel MOS transistor to provide an integrated circuit having very low power requirements.

The capability of having both partially and fully depleted SOI devices on the same wafer die has not previously been possible. Further, the possibility of making either PMOS or NMOS devices of either the partially depleted or fully depleted SOI devices has also not previously been possible.

A system for integrating both partially depleted and fully depleted SOI devices and PMOS and NMOS devices within a single die has long been sought, but has long eluded those skilled in the art.

DISCLOSURE OF THE INVENTION

The present invention provides a silicon-on-insulator semiconductor device in which a single wafer die contains a transistor in a silicon island over an insulator layer to form a fully depleted silicon-on-insulator device and a transistor formed in a semiconductor island over an insulator structure to form partially depleted silicon-on-insulator devices.

The present invention further provides a manufacturing method for having both partially and fully depleted silicon-on-insulator field effect transistor devices on the same wafer die, and a system for integrating either PMOS or NMOS devices of either the partially depleted or fully depleted silicon-on-insulator field effect transistor devices within a single die by using conventional doping processes.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
FIG. 1 is a single wafer die with a semiconductor substrate having an oxide layer with an opening thereon.

Referring now to FIG. 1, therein is shown a single wafer die 10 shown in an intermediate state of completion. A semiconductor substrate 12 of a semiconductor material such as silicon has had an insulator material such as an oxide layer 14 deposited thereon. The oxide layer 14 has been coated with a photoresist (not shown), the photoresist has been patterned and developed, the oxide layer 14 has been etched, and the photoresist has been removed to leave the oxide layer 14 with an opening 16 of about 0.5 µm to 10 µm provided therein.

Figure 2:
FIG. 2 is the structure of FIG. 1 with a liner oxide covering the oxide layer and semiconductor substrate.

Referring now to FIG. 2, therein is shown the structure of FIG. 1 after deposition of a liner insulator such as a liner oxide 18. The liner oxide 18 is a conformal layer in a thickness of about 100 Å to 500 Å which covers the oxide layer 14 and the semiconductor substrate 12.

Figure 3:
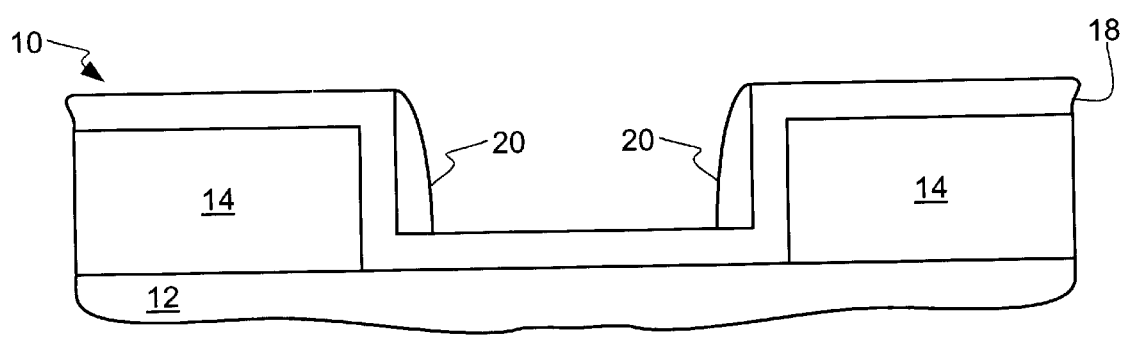
FIG. 3 is the structure of FIG. 2 with a nitride spacer deposited over the liner oxide.

Referring now to FIG. 3, therein is shown the structure of FIG. 2 having an insulator having a different selectivity from the oxide layer 14 such a nitride layer (not shown) of a thickness of about 200 Å to 1000 Å deposited thereon which is formed into a nitride spacer 20 over a portion of the semiconductor substrate 12. The nitride spacer 20 is formed by depositing the nitride layer over the liner oxide 18 and isotropically etching it until only the nitride spacer 20 remains to protect the sidewalls of the liner oxide 18 and a portion of the bottom adjacent to the semiconductor substrate 12.

Figure 4:
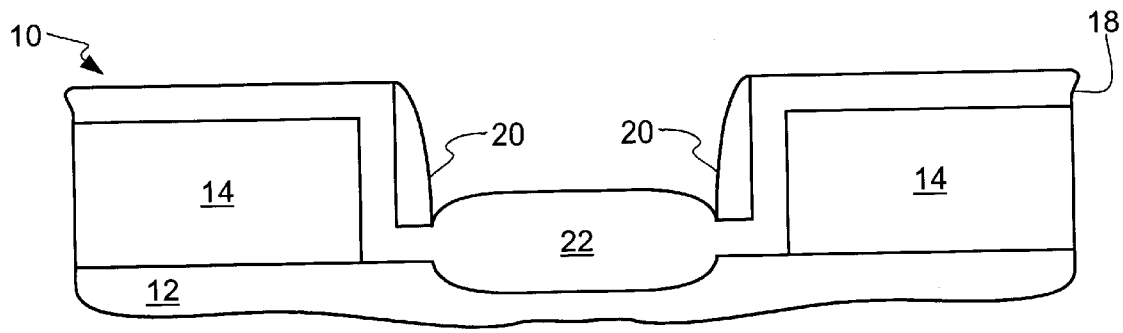
FIG. 4 is the structure of FIG. 3 showing the oxide structure formed after the step of thermal oxidation.

Referring now to FIG. 4, therein is shown the structure of FIG. 3 after a thermal processing or thermal oxidation. The thermal oxidation causes a growth of the liner oxide 18 on the semiconductor substrate 12 to form an insulator structure such as an oxide structure 22. The thermal oxidation at 800° C. to 950° C. for a few minutes in a furnace can be a wet oxidation in an $O_2$ and $H_2O$ ambient or can be a partially wet oxidation in an $O_2$, $H_2O$ and $H_2$ ambient.

Figure 5:
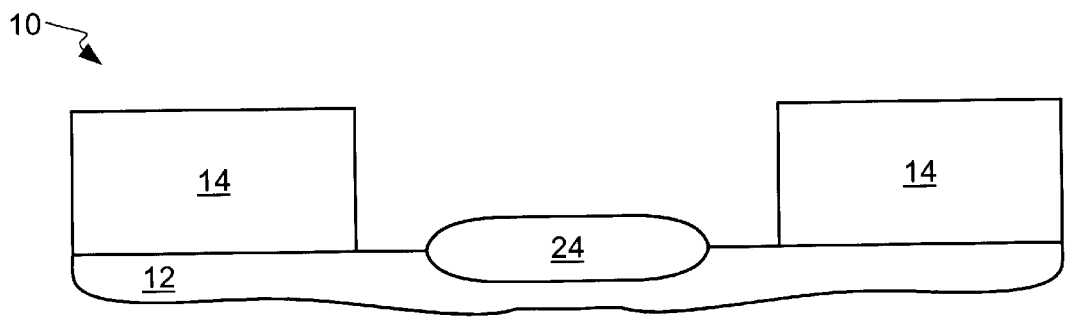
FIG. 5 is the structure of FIG. 4 after the nitride and liner oxide have been removed exposing the oxide layer and portions of the semiconductor substrate.

Referring now to FIG. 5, therein is shown the structure of FIG. 4 after a nitride removal step and an oxide strip step. In the nitride removal step, the nitride spacer 20 is etched away by a wet etch process using $H_3PO_4$ and then the liner oxide 18 is removed in an oxide strip which eliminates the oxide liner 18 and reduces the size of the oxide structure 22 to result in an oxide structure 24. At this point the oxide layer 14 and portions of the semiconductor substrate 12 are exposed.

Figure 6:
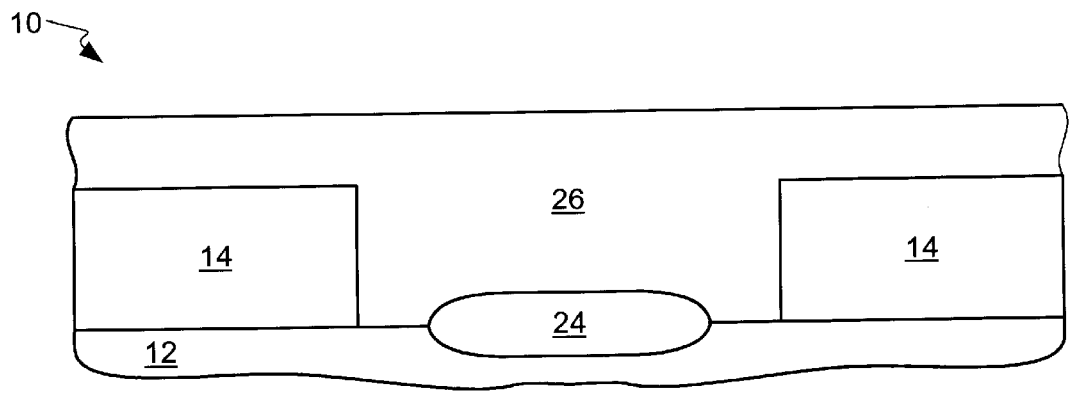
FIG. 6 is the structure of FIG. 5 after the silicon epitaxial growth (selective and non-selective) layer is added.

Referring now to FIG. 6, therein is shown the structure of FIG. 5 after growth of an insulator silicon epitaxial growth (SEG) layer or silicon layer 26. The silicon layer 26 can be grown in two stages with a first by selective epitaxial growth and the second by non-selective epitaxial growth. The silicon layer 26 covers the oxide layer 14, portions of the semiconductor substrate 12, and the oxide structure 24 to a controlled depth to be the silicon portion of the field effect transistor (FET) devices.

Figure 7:
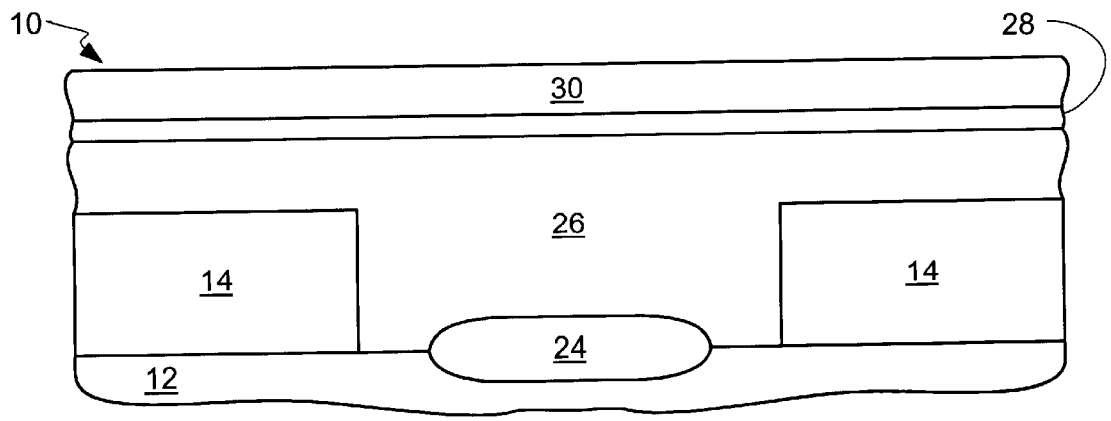
FIG. 7 is the structure of FIG. 6 with a nitride layer and an oxide layer deposited thereon to protect the active silicon and act as an oxide chemical-mechanical polishing stop layer.

Referring now to FIG. 7, therein is shown the structure of FIG. 6 having protective insulator layers of an oxide layer 28 and a nitride layer 30 deposited thereon. The oxide layer 28 is generally deposited to a thickness of approximately 100 Å and the nitride layer 30 is generally deposited to a thickness of about 1000 Å to 2000 Å.

Figure 8:
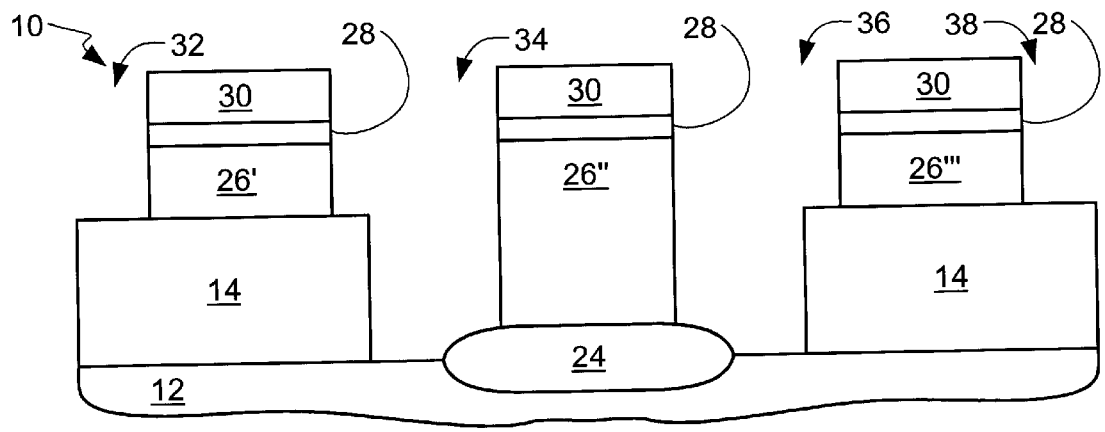
FIG. 8 is the structure of FIG. 7 after masking and dry etching the silicon epitaxial growth layer into silicon islands.

Referring now to FIG. 8, therein is shown the structure of FIG. 7 after masking and dry etching of the silicon layer 26. The structure of FIG. 7 has a photoresist (not shown) deposited thereon, the photoresist patterned, and developed. The nitride layer 30, the oxide layer 28 and the silicon layer 26 are then dry etched to form the openings 32, 34, 36, and 38 of about 0.35 μm to 10 μm which define silicon islands 26', 26", and 26'".

Figure 9:
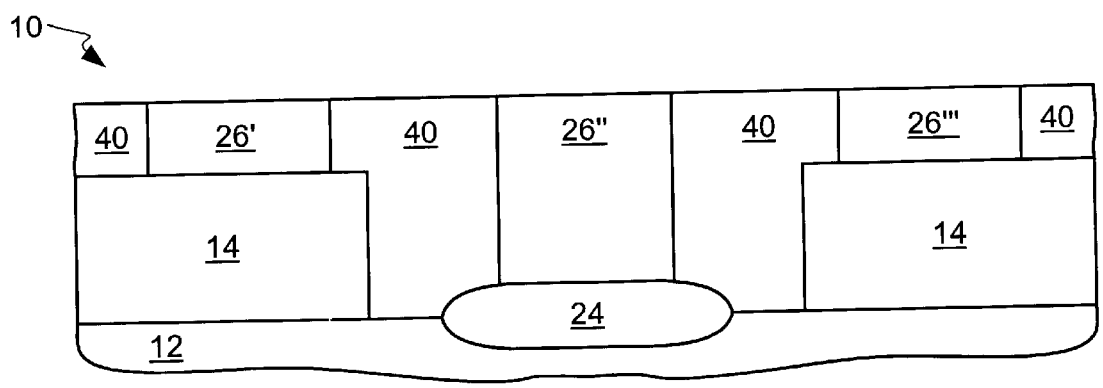
FIG. 9 is the structure of FIG. 8 after oxide deposition and chemical-mechanical polishing.

Referring now to FIG. 9, therein is shown the structure of FIG. 8 after deposition of an insulator oxide and oxide chemical-mechanical polishing (CMP). A chemical vapor deposition (CVD) process is preferably used to deposit an oxide layer over the structure shown in FIG. 8. A oxide CMP is performed and the nitride layer 30 and the oxide layer 28 act as a CMP stop layer to protect the silicon islands 26', 26", and 26'" from damage during the oxide CMP. The oxide CMP leaves the oxide layer 40 in the previous openings 32, 34, 36, and 38 and isolates the silicon islands 26', 26", and 26'".

Figure 10:
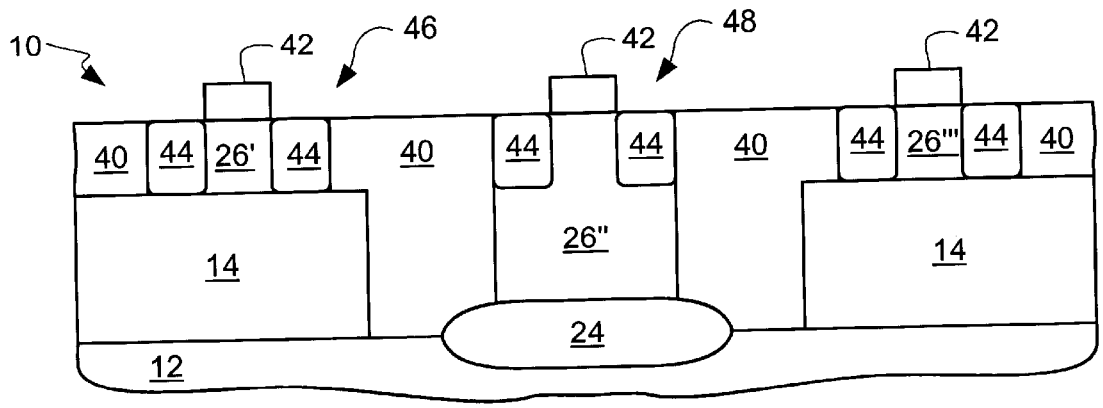
FIG. 10 is the structure of FIG. 9 showing a partially depleted silicon-on-insulator field effect transistor device disposed between two fully depleted silicon-on-insulator devices.

Referring now to FIG. 10, therein is shown the completed single wafer die 10 with gate oxides 42 in a thickness of about 10 Å to 100 Å preferably thermally grown over the silicon islands 26', 26", and 26'" and the implantations performed to form the diffusion junctions 44.

In FIG. 10, the silicon islands 26' and 26" on the insulator oxide layer 14 form two fully depleted silicon-on-insulator (SOI) devices 46 and the silicon island 26" on the insulator oxide structure 24 forms a partially depleted SOI device 48. By using conventional doping processes to implant p- and n-type dopants into the silicon islands 26' or 26", either the partially depleted or the fully depleted SOI device 46 or 48 can be formed into a PMOS or an NMOS device. This gives full flexiblity of design to an integrated circuit designer to make the components desired in all different combinations.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method for making a silicon-on-insulator semiconductor device comprising:

providing a semiconductor substrate;

depositing an insulator layer on the semiconductor substrate;

forming an opening in the insulator layer;

forming an insulator structure in a portion of the opening on the semiconductor substrate;

forming silicon on the insulator structure and the insulator layer;

forming openings in the silicon to form silicon islands;

depositing insulator in the openings;

forming gate insulators on the silicon islands; and forming junctions in the silicon islands.

2. The method as claimed in claim 1 wherein forming the insulator structure includes:

depositing a liner oxide layer;

depositing a spacer layer;

forming a spacer on a portion of the liner oxide layer in the opening in the insulator layer; and growing the insulator structure by thermal oxidation of the liner oxide layer not under the spacer.

3. The method as claimed in claim 2 wherein forming the insulator structure includes:

depositing a spacer layer of a nitride; and isotropically etching the nitride to form a nitride spacer.

4. The method as claimed in claim 1 wherein forming openings in the silicon includes:

depositing an oxide layer on the silicon;

depositing a nitride layer on the oxide layer;

depositing, patterning, and developing a photoresist;

etching the nitride layer;

etching the oxide layer; and etching the silicon.

5. The method as claimed in claim 1 wherein depositing the insulator in the openings in the silicon includes:

depositing an oxide layer on the nitride layer, on the insulator layer, on the insulator structure, and on the semiconductor substrate; and chemical mechanical polishing the oxide layer to be coplanar with the silicon.

6. The method as claimed in claim 1 wherein forming gate insulators on the silicon islands includes depositing a gate oxide on the silicon islands and the insulator in the openings and removing the gate oxide on the insulator in the openings and on a portion of the silicon islands.

7. The method as claimed in claim 1 wherein forming the gate insulator on and the junctions in the silicon island over the insulator structure forms a partially depleted silicon-on-insulator device.

8. The method as claimed in claim 1 wherein forming the gate insulator on and the junctions in the silicon island over the insulator layer forms a fully depleted silicon-on-insulator device.

9. The method as claimed in claim 1 wherein forming the gate insulator on and the junctions in the silicon island forms a P-channel silicon-on-insulator transistor.

10. The method as claimed in claim 1 wherein forming the gate insulator on and the junctions in the silicon island forms an N-channel silicon-on-insulator transistor.

11. A method for making a silicon-on-insulator semiconductor device comprising:

providing a silicon substrate;

depositing an oxide layer on the semiconductor substrate;

forming an opening in the oxide layer;

forming an oxide structure in a portion of the opening;

forming silicon by silicon epitaxial growth on the oxide structure and the oxide layer;

forming openings in the silicon to form silicon islands;

depositing oxide in the openings;

forming gate oxides on the silicon islands; and implanting junctions in the silicon islands.

12. The method as claimed in claim 11 wherein forming the oxide structure includes:

depositing a liner oxide layer;

depositing a nitride spacer layer;

forming a nitride spacer on a portion of the liner oxide layer in the opening in the insulator layer by isotropic etching; and growing the oxide structure by thermal oxidation of the liner oxide layer not under the nitride spacer.

13. The method as claimed in claim 11 wherein forming openings in the silicon and filling the openings includes:

depositing an oxide layer on the silicon;

depositing a nitride layer on the oxide layer;

depositing, patterning, and developing a photoresist;

etching the nitride layer;

etching the oxide layer;

etching the silicon to form the openings;

depositing an oxide in the openings in the silicon;

depositing an oxide layer on the nitride layer, on the insulator layer, on the insulator structure, and on the semiconductor substrate; and chemical mechanical polishing the nitride layer, the oxide layer, and the oxide to be coplanar with the silicon.

* * * * *